(12) United States Patent
Guo et al.

(10) Patent No.: US 12,501,745 B2
(45) Date of Patent: Dec. 16, 2025

(54) SEMICONDUCTOR LIGHT-EMITTING DEVICE AND MANUFACTURING METHOD THEREOF

(71) Applicant: ENKRIS SEMICONDUCTOR, INC., Jiangsu (CN)

(72) Inventors: Zhizhong Guo, Jiangsu (CN); Liyang Zhang, Jiangsu (CN)

(73) Assignee: ENKRIS SEMICONDUCTOR, INC., Jiangsu (CN)

(*) Notice: Subject to any disclaimer, the term of this patent is extended or adjusted under 35 U.S.C. 154(b) by 374 days.

(21) Appl. No.: 18/252,336

(22) PCT Filed: Nov. 27, 2020

(86) PCT No.: PCT/CN2020/132132
§ 371 (c)(1),
(2) Date: May 9, 2023

(87) PCT Pub. No.: WO2022/109990
PCT Pub. Date: Jun. 2, 2022

(65) Prior Publication Data
US 2023/0317877 A1    Oct. 5, 2023

(51) Int. Cl.
*H10H 20/814*    (2025.01)
*H10H 20/01*    (2025.01)

(52) U.S. Cl.
CPC ...... *H10H 20/8142* (2025.01); *H10H 20/018* (2025.01); *H10H 20/032* (2025.01)

(58) Field of Classification Search
CPC ............ H10H 20/8142; H10H 20/018; H10H 20/032; H10H 20/034; H10H 20/835; H10H 20/841
See application file for complete search history.

(56) References Cited

U.S. PATENT DOCUMENTS 6,046,465 A * 4/2000 Wang .................. H10H 20/815
257/E33.068
6,320,206 B1 11/2001 Coman et al.
(Continued)

FOREIGN PATENT DOCUMENTS

CN 1267109 A 9/2000
CN 1426603 A 6/2003
(Continued)

OTHER PUBLICATIONS

ISA State Intellectual Property Office of the People's Republic of China, International Search Report Issued in Application No. PCT/CN2020/132132, Sep. 2, 2021, WIPO, 5 pages.
(Continued)

*Primary Examiner* — Julia Slutsker
(74) *Attorney, Agent, or Firm* — Christopher R. Carroll; The Small Patent Law Group LLC

(57) ABSTRACT

A semiconductor light-emitting device and a manufacturing method for same. The manufacturing method for the semiconductor light-emitting device comprises: forming a dielectric layer on a substrate, the dielectric layer being provided with a plurality of openings exposing the substrate; performing epitaxial growth on the substrate using the dielectric layer as a mask to form first reflectors in the openings of the dielectric layer; growing a light-emitting structure on the side of each first reflector away from the substrate; and forming a second reflector on the side of the light-emitting structure away from the first reflector. The manufacturing process can be simplified.

20 Claims, 7 Drawing Sheets

(56) References Cited

U.S. PATENT DOCUMENTS

| | | | |
|---|---|---|---|
| 6,420,199 | B1 | 7/2002 | Coman et al. |
| 6,878,563 | B2 | 4/2005 | Bader et al. |
| 7,691,659 | B2 | 4/2010 | Bader et al. |
| 7,915,624 | B2 | 3/2011 | Jorgenson |
| 2002/0030198 | A1 | 3/2002 | Coman et al. |
| 2004/0033638 | A1 | 2/2004 | Bader et al. |
| 2004/0056254 | A1 | 3/2004 | Bader et al. |
| 2005/0282373 | A1* | 12/2005 | Bader ............... H10H 20/018 257/E33.068 |
| 2006/0011925 | A1 | 1/2006 | Bader et al. |
| 2008/0029773 | A1 | 2/2008 | Jorgenson |
| 2010/0062551 | A1 | 3/2010 | Chen et al. |
| 2014/0124732 | A1* | 5/2014 | Cha ..................... B82Y 20/00 257/13 |
| 2015/0091043 | A1* | 4/2015 | Shur .................. H10H 20/835 438/22 |
| 2019/0067906 | A1 | 2/2019 | Yuen et al. |

FOREIGN PATENT DOCUMENTS

| | | |
|---|---|---|
| CN | 1447990 A | 10/2003 |
| CN | 101523603 A | 9/2009 |
| CN | 111989777 A | 11/2020 |
| JP | 2004056109 A | 2/2004 |

OTHER PUBLICATIONS

ISA State Intellectual Property Office of the People's Republic of China, Written Opinion of the International Searching Authority Issued in Application No. PCT/CN2020/132132, Sep. 2, 2021, WIPO, 6 pages. (Submitted with Machine/Partial Translation).

State Intellectual Property Office of the People's Republic of China, Office Action and Search Report Issued in Application No. 2020801068931, Feb. 19, 2025, 15 pages. (Submitted with Machine Translation).

\* cited by examiner

SEMICONDUCTOR LIGHT-EMITTING DEVICE AND MANUFACTURING METHOD THEREOF

CROSS REFERENCE TO RELATED APPLICATIONS

This application is a U.S. National Phase of a PCT application No. PCT/CN2020/132132 filed on Nov. 27, 2020, the entire contents of which are incorporated herein by reference in their entireties.

TECHNICAL FIELD

The present disclosure relates to the technical field of semiconductors, in particular to a semiconductor light-emitting device and a manufacturing method of a semiconductor light-emitting device.

BACKGROUND

In recent years, semiconductor light-emitting devices, as a new generation of green light sources, have been widely used in lighting, backlight, display, indicating and other fields.

In order to improve the performance of semiconductor light-emitting devices, resonant cavities are usually formed in semiconductor light-emitting devices. In the manufacturing process of a semiconductor light-emitting device with a resonant cavity, a first reflector, a light-emitting structure, and a second reflector are usually sequentially formed on a substrate. However, in order to form multiple semiconductor light-emitting devices, it is necessary to pattern the first reflector, and the manufacturing process is relatively complex.

SUMMARY

In view of this, the present disclosure provides a semiconductor light-emitting device and a manufacturing method of a semiconductor light-emitting device.

According to an aspect of the present disclosure, a manufacturing method for a semiconductor light-emitting device is provided, including:
forming a dielectric layer on a substrate, where the dielectric layer is provided with multiple openings exposing the substrate;
by using the dielectric layer as a mask, performing epitaxial growth on the substrate to form a first reflector within each of the multiple openings of the dielectric layer;
growing a light-emitting structure on a side of the first reflector far from the substrate; and
forming a second reflector on a side of the light-emitting structure far from the first reflector.

In some embodiment, the second reflector includes a Bragg reflector or a metallic reflector.

In some embodiment, the second reflector includes a Bragg reflector, and before forming the second reflector, the manufacturing method further includes:
forming an ITO layer on a side of the light-emitting structure far from the first reflector, where the second reflector is formed on a surface of the ITO layer far from the first reflector.

In some embodiment, a surface of the light-emitting structure far from the substrate is flush with a surface of the dielectric layer far from the substrate, and multiple light-emitting structures share one ITO layer.

In some embodiment, after forming the second reflector on the side of the light-emitting structure far from the first reflector, the manufacturing method further includes:
forming a supporting layer covering the second reflector and the dielectric layer; and
removing the substrate.

In some embodiment, the manufacturing method further includes: providing a buffer layer between the substrate and the first reflector, where removing the substrate includes:
removing the substrate and the buffer layer; and
after removing the substrate and the buffer layer, the manufacturing method further includes:
making a surface of the dielectric layer far from the supporting layer flush with a surface of the first reflector far from the supporting layer.

In some embodiment, after removing the substrate, the manufacturing method further includes:
patterning the dielectric layer to form multiple tubular components, where the multiple tubular components are around the multiple openings respectively.

In some embodiment, the light-emitting structure includes a light-emitting layer, the light-emitting layer includes a first-conductivity-type semiconductor layer, an active layer and a second-conductivity-type semiconductor layer that are stacked, and after removing the substrate, the manufacturing method further includes:
forming a first electrode electrically connected to the first-conductivity-type semiconductor layer and a second electrode electrically connected to the second-conductivity-type semiconductor layer.

In some embodiment, the first electrode and the second electrode are located on the same side of the supporting layer; or
the first electrode and the second electrode are located on two sides of the supporting layer, and a material of the supporting layer is a conductive material.

In some embodiment, the first reflector is a Bragg reflector.

In some embodiment, the first reflector is a porous conductive structure, the porous conductive structure includes one or more first porous conductive layers and one or more second porous conductive layers alternately stacked that are formed after electrochemical corrosion, multiple first holes are formed in each of the one or more first porous conductive layers, multiple second holes are formed in each of the one or more second porous conductive layers, and diameters of the multiple first holes are different from diameters of the multiple second holes.

In some embodiment, a material of the dielectric layer includes silicon oxide, and a material of the first reflector includes a III-V semiconductor material.

In some embodiment, the light-emitting structure includes an oxide layer, the oxide layer includes a low resistance region and a high resistance region surrounding the low resistance region.

According to an aspect of the present disclosure, a semiconductor light-emitting device is provided, which is manufactured by the above manufacturing method of a semiconductor light-emitting device.

Figure 1:
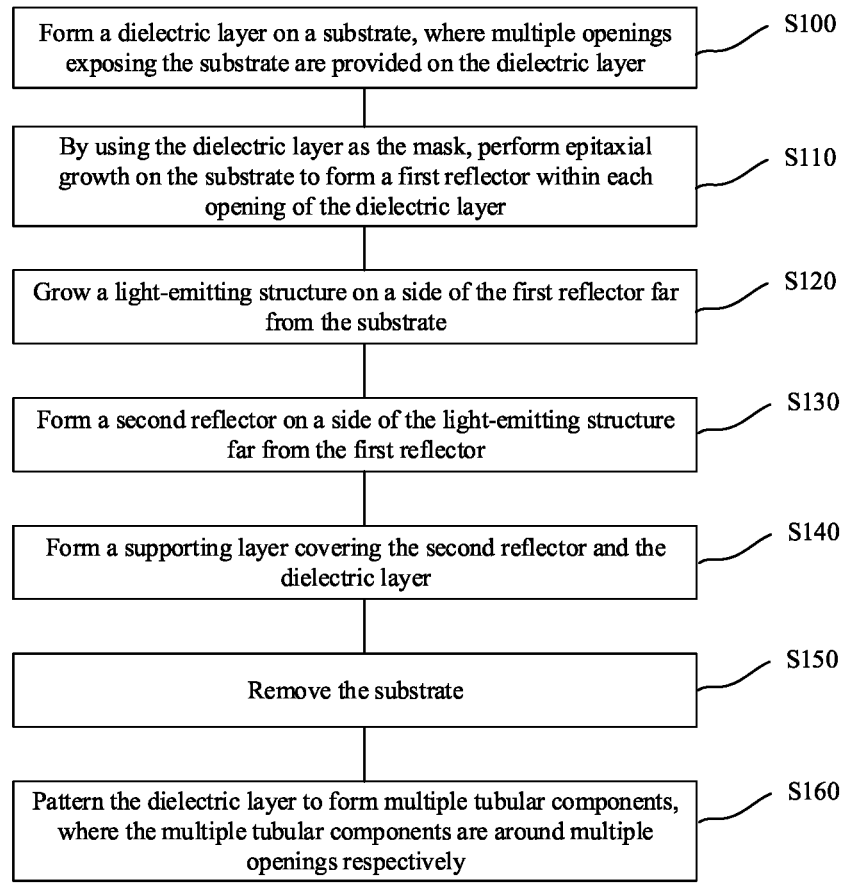
FIG. 1 is a flowchart of a manufacturing method for a semiconductor light-emitting device according to Embodiment 1 of the present disclosure.

Explanation of reference numerals: 1. substrate; 2. dielectric layer; 201. opening; 202. tubular component; 3. first reflector; 301. first porous conductive layer; 302. second porous conductive layer; 4. light-emitting structure; 40. light-emitting layer; 401. first-conductivity-type semiconductor layer; 402. active layer; 403. second-conductivity-type semiconductor layer; 41. oxide layer; 5. second reflector; 6. buffer layer; 7. ITO layer; 8. supporting layer; 801. metallic bond layer; 802. heavily-doped silicon substrate; 9. second electrode; 10. first electrode; 11. metallic protection layer.

DETAILED DESCRIPTION OF THE EMBODIMENTS

Exemplary embodiments will be described in detail herein, examples of which are illustrated in the accompanying drawings. Where the following description refers to the drawings, the same numerals in different drawings refer to the same or similar elements unless otherwise indicated. Embodiments described in the illustrative examples below are not intended to represent all embodiments consistent with the present disclosure. Rather, they are merely embodiments of devices consistent with some aspects of the present disclosure as recited in the appended claims.

Embodiment 1

In Embodiment 1 of the present disclosure, a semiconductor light-emitting device and a manufacturing method for a semiconductor light-emitting device are provided. As shown in FIG. 1, the manufacturing method of the semiconductor light-emitting device can include steps S100 to S130.

In step S100, a dielectric layer is formed on a substrate, where multiple openings exposing the substrate are provided on the dielectric layer.

In step S110, using the dielectric layer as the mask, epitaxial growth is performed on the substrate to form a first reflector within each opening of the dielectric layer.

In step S120, a light-emitting structure is grown on a side of the first reflector far from the substrate.

In step S130, a second reflector is formed on a side of the light-emitting structure far from the first reflector.

In the manufacturing method of a semiconductor light-emitting device according to Embodiment 1 of the present disclosure, the dielectric layer has multiple openings, and a first reflector is grown using the dielectric layer as a mask to form the first reflector within each opening, to form multiple first reflectors that are spaced. Therefore, there is no need to further pattern the first reflector, which simplifies the manufacturing process of the semiconductor light-emitting device.

The following is a detailed explanation of the various steps of the manufacturing method of a semiconductor light-emitting device according to Embodiment 1 of the present disclosure.

In step S100, a dielectric layer is formed on a substrate, where multiple openings exposing the substrate are provided on the dielectric layer.

Figure 2:
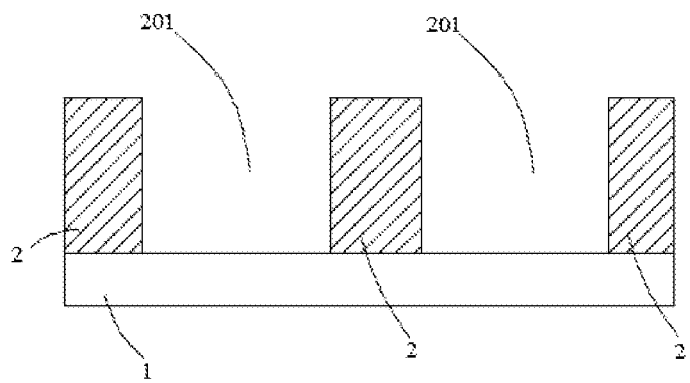
FIG. 2 is a schematic structural diagram of a semiconductor light-emitting device after step S100 is completed in the manufacturing method according to Embodiment 1 of the present disclosure.

As shown in FIG. 2, the substrate 1 can include a silicon substrate, or the substrate 1 can also include a silicon carbide substrate, which is not limited in the embodiments of the present disclosure. The substrate 1 can also include a sapphire substrate. A material of the dielectric layer 2 can include silicon oxide, such as $SiO_2$. In the thickness direction of the dielectric layer 2, the opening 201 penetrates through the dielectric layer 2. The number of openings 201 can be two, four, or more, and the openings 201 are spaced. For example, step S100 can include forming a dielectric material layer on a substrate 1, patterning the dielectric material layer to form the dielectric layer 2, which is provided with openings 201 that expose the substrate 1. The dielectric material layer can be manufactured by vapor deposition, and of course, it can also be manufactured by other methods. In the embodiments of the present disclosure, the dielectric material layer can be patterned through a photolithography process.

In step S110, by using the dielectric layer as the mask, epitaxial growth is performed on the substrate to form a first reflector within each opening of the dielectric layer.

Figure 3:
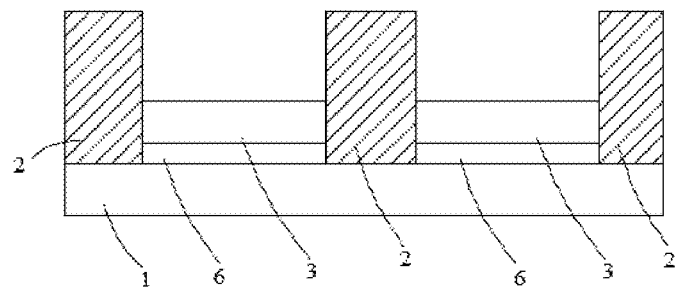
FIG. 3 is a schematic structural diagram of a semiconductor light-emitting device after step S110 is completed in the manufacturing method according to Embodiment 1 of the present disclosure.
Figure 4:
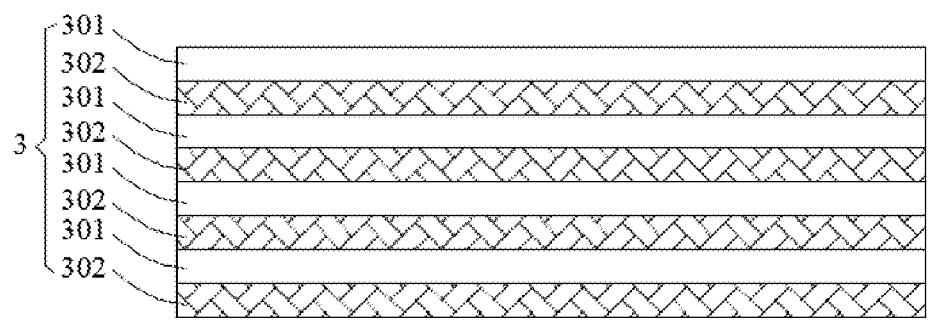
FIG. 4 is a schematic structural diagram of a first reflector in a semiconductor light-emitting device according to Embodiment 1 of the present disclosure.

As shown in FIG. 3, in the embodiment of the present disclosure, the substrate 1 can be epitaxially grown by the atomic layer deposition method, or the substrate 1 can be epitaxially grown by the chemical vapor deposition method, which is not limited in the embodiment of the present disclosure. The first reflector 3 can include a Bragg reflector. Furthermore, the first reflector 3 of the Bragg reflector can include a porous conductive structure. As shown in FIG. 4, the porous conductive structure can include a first porous conductive layer 301 and a second porous conductive layer 302 alternately stacked that are formed after electrochemical corrosion. Multiple first holes can be formed in the first porous conductive layer 301, multiple second holes can be formed in the second porous conductive layer 302, and a diameter of the first hole is different from a diameter of the second hole. The refractive index difference between the first porous conductive layer 301 and the second porous conductive layer 302 is significant, which improves the reflectivity of the first reflector 3. A material of the first reflector 3 can include a III-V semiconductor material. Taking the first reflector 3 including the first porous conductive layers 301 and the second porous conductive layers 302 that are alternately stacked as an example, both the first porous conductive layers 301 and the second porous conductive layers 302 are gallium nitride based materials. For example, a material of the first porous conductive layer 301 includes n-type GaN or n-type AlInGaN, and a material of the second porous conductive layer 302 includes undoped-type GaN or undoped-type AlInGaN. In addition, in the embodiments of the present disclosure, before the first reflector 3 is formed, a buffer layer 6 can be formed within each opening 201 of the dielectric layer 2, and the first reflector 3 is formed on a side of the buffer layer 6 far from the substrate 1.

In step S120, a light-emitting structure is grown on a side of the first reflector far from the substrate.

Figure 5:
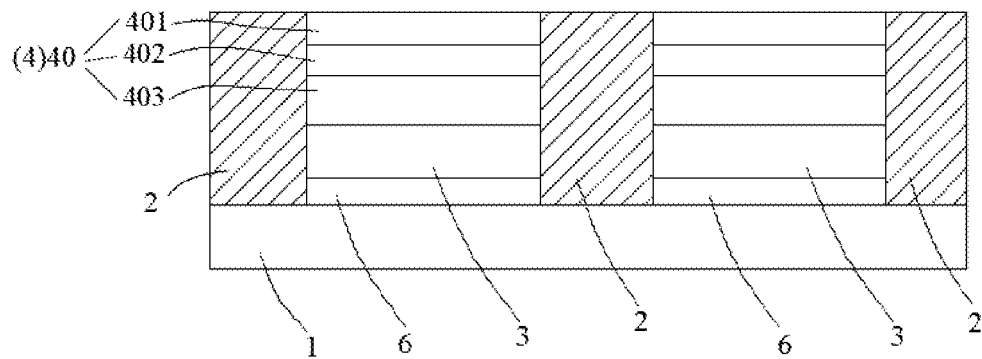
FIG. 5 is a schematic structural diagram of a semiconductor light-emitting device after step S120 is completed in the manufacturing method according to Embodiment 1 of the present disclosure.

As shown in FIG. 5, the light-emitting structure 4 can include a light-emitting layer 40. The light-emitting layer 40 can include a first-conductivity-type semiconductor layer 401, an active layer 402, and a second-conductivity-type semiconductor layer 403 that are stacked. The active layer 402 can be at least one of a single quantum well structure, a multiple quantum well (MQW) structure, a quantum line structure or a quantum dot structure. Taking the active layer 402 being a multi quantum well structure as an example, the active layer 402 can include a potential well layer and a barrier layer that are alternately arranged. The first conductive type is different from the second conductive type. The first-conductivity-type semiconductor layer 401 can be a p-type semiconductor layer, and the second-conductivity-type semiconductor layer 403 can be an n-type semiconductor layer, which is not limited in the embodiments of the present disclosure. In addition, a surface of the light-emitting structure 4 located within each opening 201 far from the substrate 1 can be flush with a surface of the dielectric layer 2 far from the substrate 1. In related technologies, the light-emitting structure 4 needs to be deeply etched to penetrate the PN junction, such that one light-emitting structure 4 becomes multiple. In the embodiments of the present disclosure, the light-emitting structures 4 are respectively located within the openings 201 of the structure shown in FIG. 2, avoiding damage to the light-emitting structure 4 during the deep etching process where the PN junction is penetrated through.

In step S130, a second reflector is formed on a side of the light-emitting structure far from the first reflector.

Figure 6:
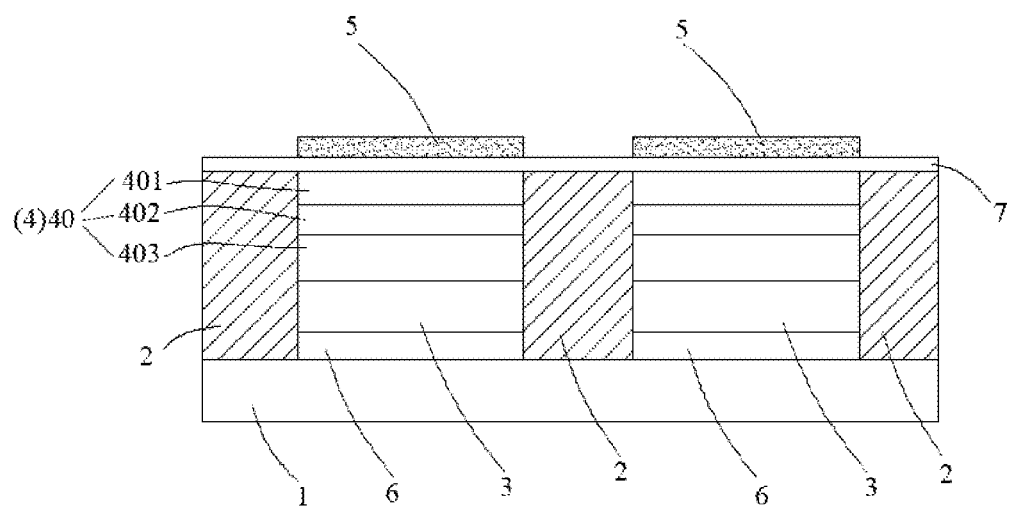
FIG. 6 is a schematic structural diagram of a semiconductor light-emitting device after step S130 is completed in the manufacturing method according to Embodiment 1 of the present disclosure.

As shown in FIG. 6, a reflectivity of the second reflector 5 can be lower than a reflectivity of the first reflector 3, which is not limited in the embodiments of the present disclosure. The second reflector 5 can include a Bragg reflector, and a material of the second reflector 5 can be a set of multi-period materials selected from material groups including $TiO_2/SiO_2$, $Ti_3/SiO_2$, $Ta_2O_5/SiO_2$, $Ti_3O_5/Al_2O_3$, $ZrO_2/SiO_2$, or $TiO_2/Al_2O_3$, which is not limited in the embodiments of the present disclosure. Before the second reflector 5 is formed, this embodiment can further include forming an ITO (Indium tin oxide) layer 7 on a side of the light-emitting structure 4 far from the first reflector 3. The second reflector 5 is formed on a surface of the ITO layer 7 far from the first reflector 3. Taking the surface of each light-emitting structure 4 far from the substrate 1 being flush with the surface of the dielectric layer 2 far from the substrate 1 as an example, multiple light-emitting structures 4 can share one ITO layer 7.

After the second reflector 5 is formed, as shown in FIG. 1, the manufacturing method according to the embodiments of the present disclosure can further include steps S140 to S160.

In step S140, a supporting layer covering the second reflector and the dielectric layer is formed.

Figure 7:
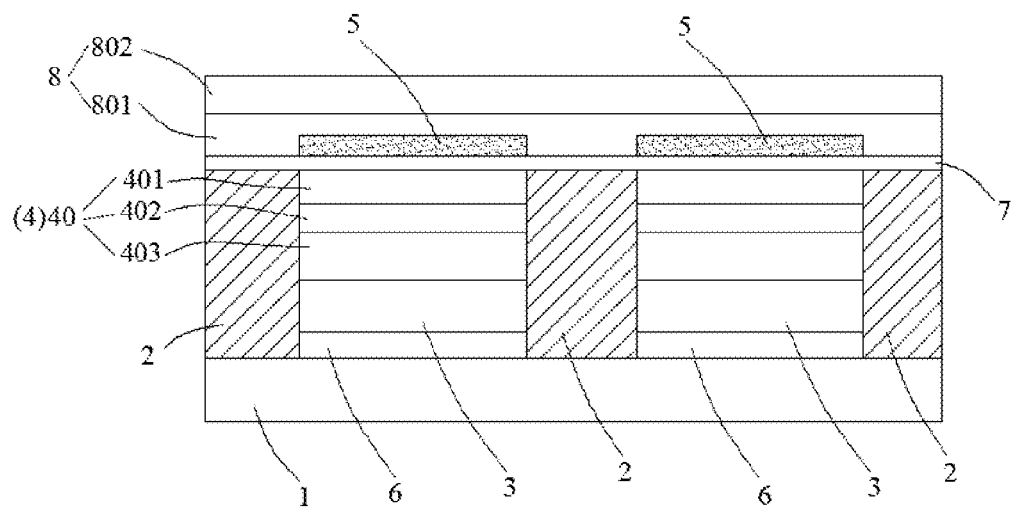
FIG. 7 is a schematic structural diagram of a semiconductor light-emitting device after step S140 is completed in the manufacturing method according to Embodiment 1 of the present disclosure.

As shown in FIG. 7, a material of the supporting layer 8 can be a conductive material, that is, the supporting layer 8 can be a conductor. The supporting layer 8 can be in contact with the ITO layer 7, and the second reflector 5 is wrapped between the supporting layer 8 and the ITO layer 7. The supporting layer 8 can include a heavily-doped silicon substrate 802 and a metallic bond layer 801. The heavily-doped silicon substrate 802 may be located on a side of the metallic bond layer 801 far from the dielectric layer 2.

In step S150, the substrate is removed.

Figure 8:
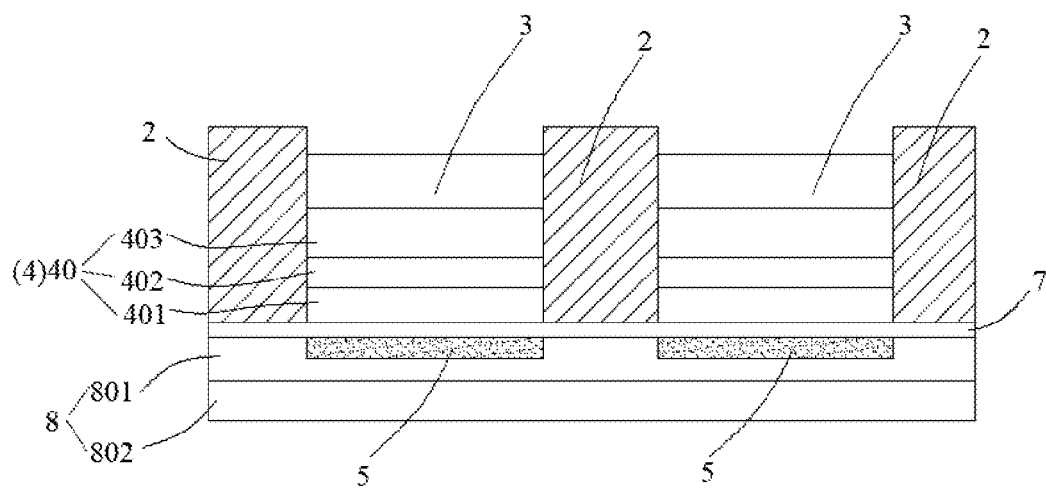
FIG. 8 is a schematic structural diagram of a semiconductor light-emitting device after step S150 is completed in the manufacturing method according to Embodiment 1 of the present disclosure.
Figure 9:
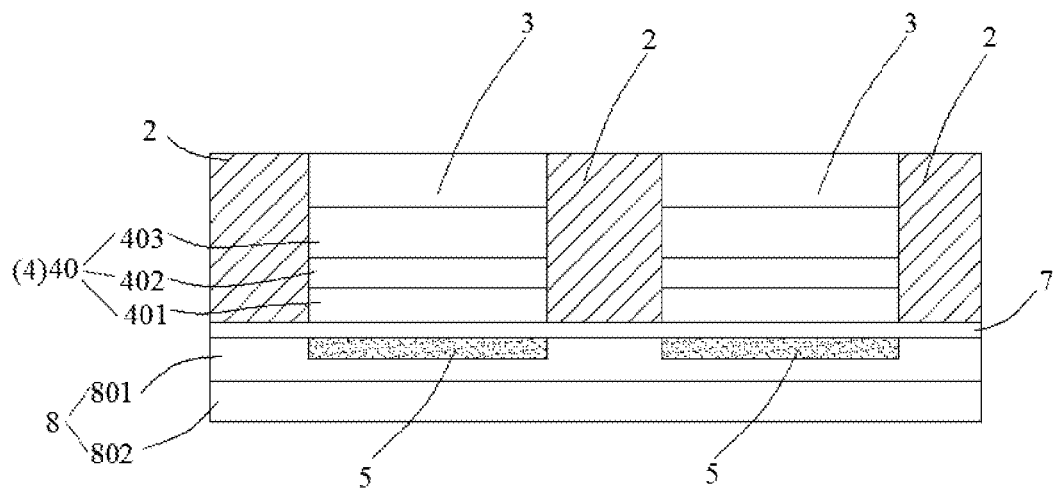
FIG. 9 is a schematic structural diagram of the structure shown in FIG. 8 after grinding.

As shown in FIGS. 7 and 8, the substrate 1 can be removed by a laser peeling process, which is not limited in the embodiments of the present disclosure. Taking the buffer layer 6 being provided between the substrate 1 and the first reflector 3 as an example, removing the substrate 1 can include removing the substrate 1 and the buffer layer 6. After the substrate 1 and the buffer layer 6 are removed, the manufacturing method according to the embodiments of the present disclosure can further include, as shown in FIG. 9, making a surface of the dielectric layer 2 far from the supporting layer 8 flush with a surface of the first reflector 3 far from the supporting layer 8. In the embodiments of the present disclosure, the surface of the dielectric layer 2 far from the supporting layer 8 can be ground, to make the surface of the dielectric layer 2 far from the supporting layer 8 flush with the surface of the first reflector 3 far from the supporting layer 8.

In step S160, the dielectric layer is patterned to form multiple tubular components, where the multiple tubular components are around multiple openings respectively.

Figure 10:
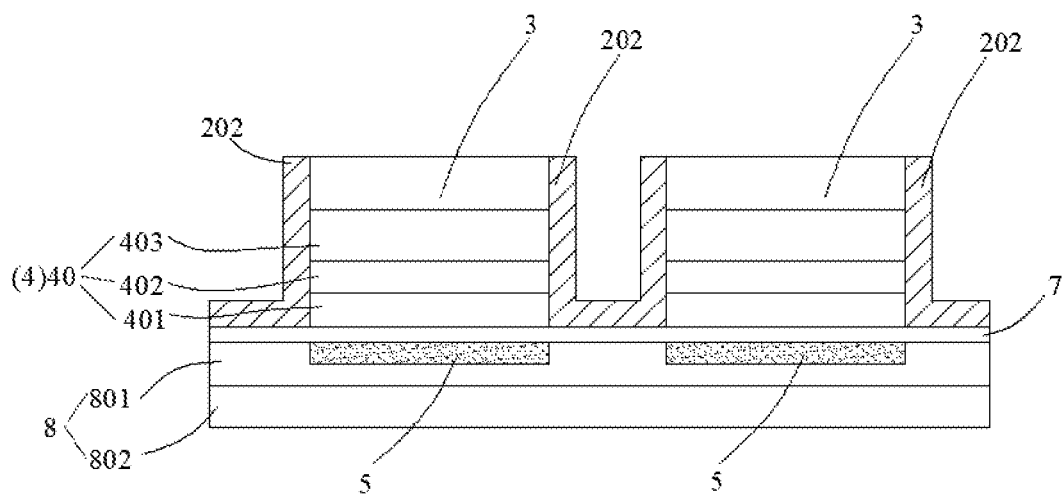
FIG. 10 is a schematic structural diagram of a semiconductor light-emitting device after step S160 is completed in the manufacturing method according to Embodiment 1 of the present disclosure.

As shown in FIG. 10, in the embodiments of the present disclosure, the dielectric layer 2 can be patterned through the photolithography process. The tubular component 202 can serve as an insulation protection layer to protect side walls of the light-emitting device, reducing the steps of manufacturing the insulation protection layer and saving costs.

In Embodiment 1 of the present disclosure, a semiconductor light-emitting device is further provided. The semiconductor light-emitting device is manufactured by the above manufacturing method of a semiconductor light-emitting device, therefore, having the same beneficial effect, which is not repeated here in the present disclosure.

Embodiment 2

Figure 11:
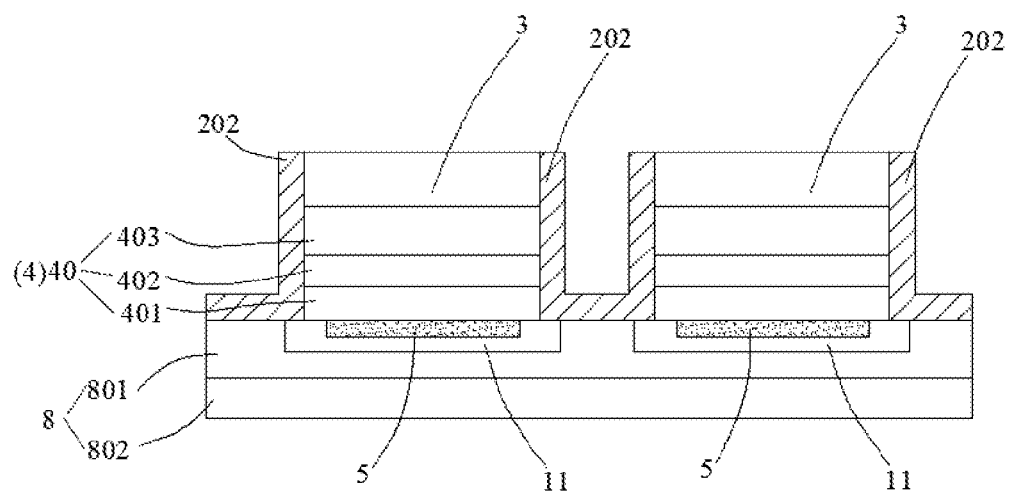
FIG. 11 is a schematic structural diagram of a semiconductor light-emitting device according to Embodiment 2 of the present disclosure.

A semiconductor light-emitting device and a manufacturing method of a semiconductor light-emitting device according to Embodiment 2 of the present disclosure is roughly the same as the semiconductor light-emitting device and the manufacturing method of a semiconductor light-emitting device according to Embodiment 1 of the present disclosure, and the difference lies in the second reflector. As shown in FIG. 11, the second reflector 5 according to embodiment 2 of the present disclosure is a metallic reflector. A material of the metallic reflector can include Ag, Ni/Ag/Ni, etc. Furthermore, in order to avoid oxidation of the second reflector 5, in the Embodiment 2 of the present disclosure. a metallic protection layer 11 covering the second reflector 5 can be further formed. A material of the metallic protection layer 11 can include Ni, TiW, Pt, etc. The supporting layer 8 can cover the metallic protection layer 11.

Embodiment 3

Figure 12:
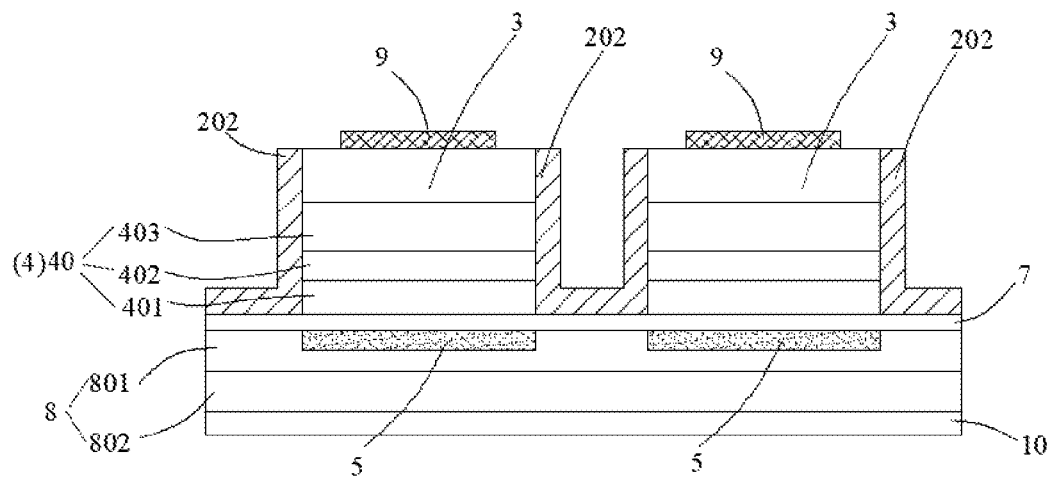
FIG. 12 is a schematic structural diagram of a semiconductor light-emitting device according to Embodiment 3 of the present disclosure.
Figure 13:
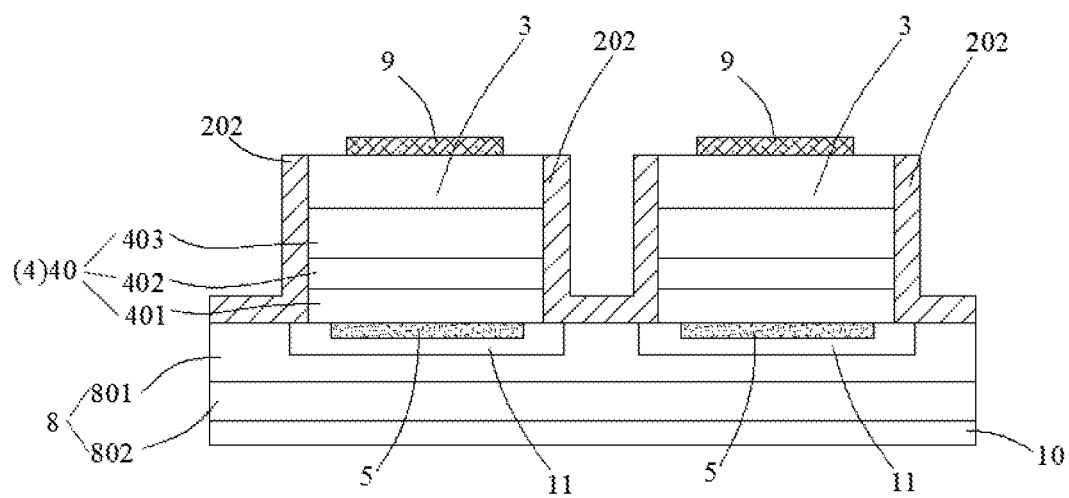
FIG. 13 is a schematic structural diagram of a semiconductor light-emitting device according to Embodiment 3 of the present disclosure.

A semiconductor light-emitting device and a manufacturing method of a semiconductor light-emitting device according to Embodiment 3 of the present disclosure is roughly the same as the semiconductor light-emitting device and the manufacturing method of a semiconductor light-emitting device according to Embodiment 1 or Embodiment 2 of the present disclosure, and the difference lies in that as shown in FIGS. 12 and 13, a first electrode 10 electrically connected to the first-conductivity-type semiconductor layer 401 and a second electrode 9 electrically connected to the second-conductivity-type semiconductor layer 403 are further formed. Taking the material of the supporting layer 8 being a conductive material as an example, the first electrode 10 and the second electrode 9 can be located on both sides of the supporting layer 8. Specifically, the first electrode 10 can be located on a surface of the supporting layer 8 far from the light-emitting structure 4, and the second electrode 9 can be located on a surface of the first reflector 3 far from the light-emitting structure 4. In this way, the first electrode 10 and the second electrode 9 are located on both sides of the light-emitting structure 4. The semiconductor light-emitting device according to Embodiment 3 of the present disclosure can be a resonant cavity LED. Taking the first-conductivity-type semiconductor layer 401 being a p-type semiconductor layer and the second-conductivity-type semiconductor layer 403 being an n-type semiconductor layer as an example, the first electrode 10 is a p-type electrode and the second electrode 9 is an n-type electrode. A material of the first electrode 10 and a material of the second electrode 9 can include at least one of gold, silver, aluminum, chromium, nickel, platinum or titanium.

Embodiment 4

A semiconductor light-emitting device and a manufacturing method of a semiconductor light-emitting device according to Embodiment 4 of the present disclosure is roughly the same as the semiconductor light-emitting device and the manufacturing method of a semiconductor light-emitting device according to Embodiment 3 of the present disclosure, and the difference lies in that the first electrode and the second electrode are located on the same side of the supporting layer. Specifically, both the first electrode and the second electrode are located on a side of the first-conductivity-type semiconductor layer far from the second reflector. The first electrode can be provided on a surface of the first-conductivity-type semiconductor layer far from the second reflector, and the second electrode can be provided on a surface of the first reflector far from the light-emitting structure. The semiconductor light-emitting device in Embodiment 4 of the present disclosure is also a resonant cavity LED.

Embodiment 5

Figure 14:
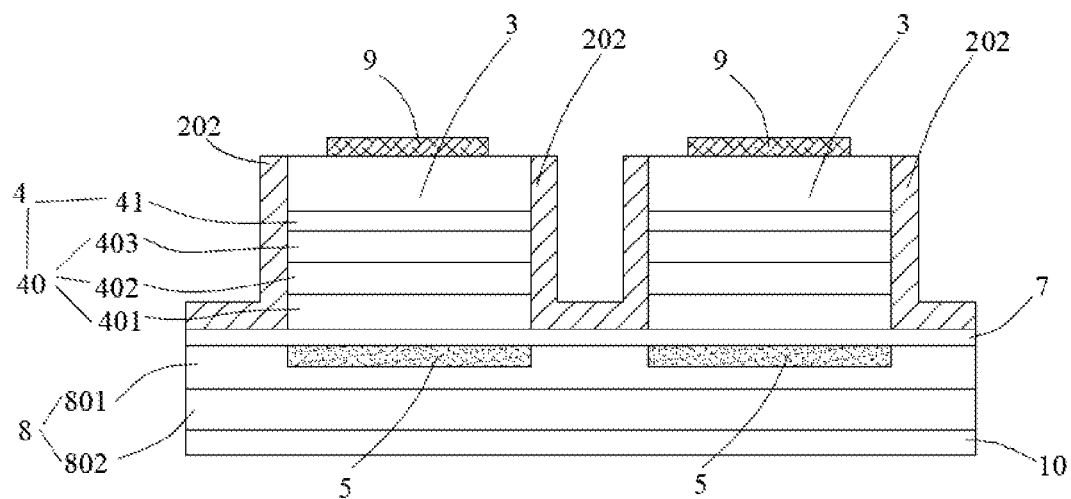
FIG. 14 is a schematic structural diagram of a semiconductor light-emitting device according to Embodiment 5 of the present disclosure.
Figure 15:
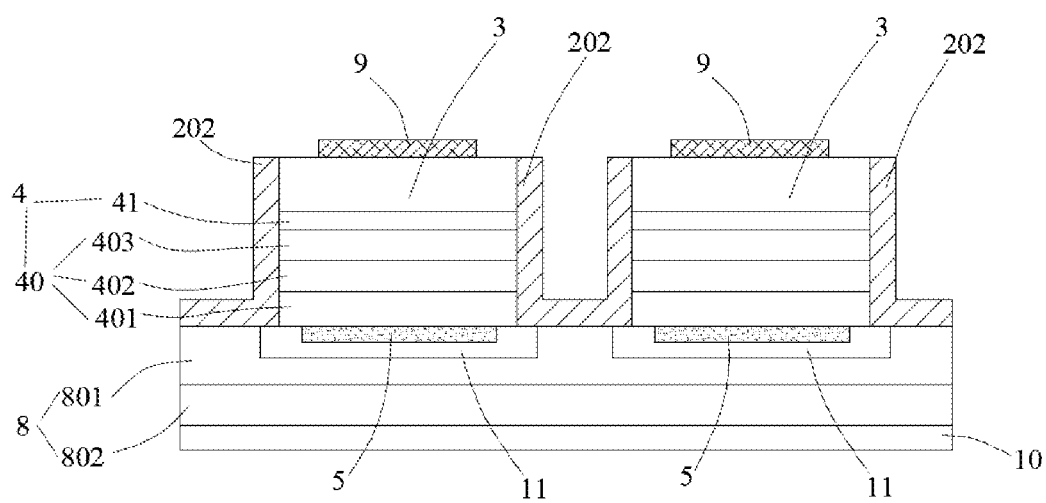
FIG. 15 is a schematic structural diagram of a semiconductor light-emitting device according to Embodiment 5 of the present disclosure.

A semiconductor light-emitting device and a manufacturing method of a semiconductor light-emitting device according to Embodiment 5 of the present disclosure is roughly the same as the semiconductor light-emitting device and the manufacturing method of a semiconductor light-emitting device according to Embodiment 3 or Embodiment 4 of the present disclosure, and the difference lies in the light-emitting structure. As shown in FIGS. 14 and 15, the light-emitting structure 4 of Embodiment 5 of the present disclosure may include an oxide layer 41. The oxide layer 41 can be stacked with the light-emitting layer 40. The oxide layer 41 can include a low resistance region and a high resistance region. The high resistance region surrounds the low resistance region, and the low resistance region forms a current aperture, i.e. an internal current window, so that the light-emitting device according to Embodiment 5 of the present disclosure constitutes a vertical cavity surface emitting laser (VCSEL). The low resistance region further forms the optical path of the vertical cavity surface emitting laser.

As shown in FIGS. 14 and 15, taking the light-emitting layer 40 including a first-conductivity-type semiconductor layer 401, an active layer 402, and a second-conductivity-type semiconductor layer 403 that are stacked as an example, the oxide layer 41 may also be located on a side of the second-conductivity-type semiconductor layer 403 far from the active layer 402. In addition, the oxide layer 41 can also be located in the active layer 402. The number of oxide layers 41 can be multiple. Taking the number of oxide layers 41 being two as an example, one oxide layer 41 can be located in the active layer 402, and the other oxide layer 41 can be located on a side of the second-conductivity-type semiconductor layer 403 far from the active layer 402. In the embodiments of the present disclosure, the oxide layer 41 can be obtained by oxidizing a monolayer structure of AlInN, AlGaAs, AlAs, or AlN, or by oxidizing a multilayer structure of AlInN/GaN, AlN/GaN, AlGaAs/GaN, or AlAs/GaN.

In the semiconductor light-emitting device and the manufacturing method of a semiconductor light-emitting device disclosed in the present disclosure, the dielectric layer has multiple openings, and the first reflector is grown by using the dielectric layer as a mask, and the first reflector is formed in each opening to form multiple spaced first reflector. Therefore, there is no need to further pattern the first reflector, which simplifies the manufacturing process of the semiconductor light-emitting device. In some embodiments, the surface of each light-emitting structure far from the substrate is flush with the surface of the dielectric layer far from the substrate, i.e., each light-emitting structure is also located in each opening, such that multiple spaced light-emitting structures are formed without performing etching, avoiding damage to the light-emitting structure 4 during the deep etching process where the PN junction is penetrated through. In some embodiments, the first electrode and the second electrode are located on both sides of the support layer, and the material of the support layer is a conductive material, that is, the semiconductor light-emitting device has a vertical electrode structure, which improves the electrostatic discharge capability of the device.

The above are only some embodiments of the present disclosure, and do not limit the present disclosure in any form. Although the present disclosure has been disclosed as above in the preferred embodiments, the preferred embodiments are not used to limit the present disclosure. Any skilled person familiar with this profession, without departing from the scope of the technical solutions of the present disclosure, may use the technical content disclosed above to change or modify them into equivalent embodiments with equivalent changes. However, any simple modifications, equivalent changes and modifications made to the above embodiments based on the technical essence of the present disclosure, which do not deviate from the content of the technical solution of the present disclosure, still fall within the scope of the technical solution of the present disclosure.

The invention claimed is:

1. A manufacturing method of a semiconductor light-emitting device, comprising:
    forming a dielectric layer on a substrate, wherein the dielectric layer is provided with multiple openings exposing the substrate;
    by using the dielectric layer as a mask, performing epitaxial growth on the substrate to form a first reflector within each of the multiple openings of the dielectric layer;
    growing a light-emitting structure on a side of the first reflector away from the substrate, wherein the light-emitting structure is located within one of the multiple openings; and
    forming a second reflector on a side of the light-emitting structure away from the first reflector.

2. The manufacturing method according to claim 1, wherein the second reflector comprises a Bragg reflector or a metallic reflector.

3. The manufacturing method according to claim 2, wherein the second reflector comprises the Bragg reflector, and before forming the second reflector, the manufacturing method further comprises:
    forming an ITO layer on the side of the light-emitting structure away from the first reflector, wherein the second reflector is formed on a surface of the ITO layer away from the first reflector.

4. The manufacturing method according to claim 3, wherein a surface of the light-emitting structure away from the substrate is flush with a surface of the dielectric layer away from the substrate, and multiple light-emitting structures share one ITO layer.

5. The manufacturing method according to claim 1, wherein after forming the second reflector on the side of the light-emitting structure away from the first reflector, the manufacturing method further comprises:
    forming a supporting layer covering the second reflector and the dielectric layer; and
    removing the substrate.

6. The manufacturing method according to claim 5, further comprising: providing a buffer layer between the substrate and the first reflector, wherein
    removing the substrate comprises:
    removing the substrate and the buffer layer; and
    after removing the substrate and the buffer layer, the manufacturing method further comprises:
    making a surface of the dielectric layer away from the supporting layer flush with a surface of the first reflector away from the supporting layer.

7. The manufacturing method according to claim 6, wherein after removing the substrate, the manufacturing method further comprises:
    patterning the dielectric layer to form multiple tubular components, wherein the multiple tubular components are around the multiple openings respectively.

8. The manufacturing method according to claim 5, wherein the light-emitting structure comprises a light-emitting layer, the light-emitting layer comprises a first-conductivity-type semiconductor layer, an active layer and a second-conductivity-type semiconductor layer that are stacked, and after removing the substrate, the manufacturing method further comprises:
    forming a first electrode electrically connected to the first-conductivity-type semiconductor layer and a second electrode electrically connected to the second-conductivity-type semiconductor layer.

9. The manufacturing method according to claim 8, wherein
    the first electrode and the second electrode are located on the same side of the supporting layer; or
    the first electrode and the second electrode are located on two sides of the supporting layer, and
    a material of the supporting layer is a conductive material.

10. The manufacturing method according to claim 1, wherein the first reflector is a Bragg reflector.

11. The manufacturing method according to claim 10, wherein the first reflector is a porous conductive structure, the porous conductive structure comprises one or more first porous conductive layers and one or more second porous conductive layers alternately stacked that are formed after electrochemical corrosion, multiple first holes are formed in each of the one or more first porous conductive layers, multiple second holes are formed in each of the one or more second porous conductive layers, and diameters of the multiple first holes are different from diameters of the multiple second holes.

12. The manufacturing method according to claim 1, wherein a material of the dielectric layer comprises silicon oxide, and a material of the first reflector comprises a III-V semiconductor material.

13. The manufacturing method according to claim 1, wherein the light-emitting structure comprises an oxide layer, the oxide layer comprises a first region and a second region surrounding the first region, wherein a resistance of the second region is higher than a resistance of the first region.

14. A semiconductor light-emitting device manufactured by a manufacturing method, wherein the manufacturing method comprises:
    forming a dielectric layer on a substrate, wherein the dielectric layer is provided with multiple openings exposing the substrate;
    by using the dielectric layer as a mask, performing epitaxial growth on the substrate to form a first reflector within each of the multiple openings of the dielectric layer;
    growing a light-emitting structure on a side of the first reflector away from the substrate, wherein the light-emitting structure is located within one of the multiple openings; and
    forming a second reflector on a side of the light-emitting structure away from the first reflector.

15. The semiconductor light-emitting device according to claim 14, wherein the second reflector comprises a Bragg reflector or a metallic reflector.

16. The semiconductor light-emitting device according to claim 15, wherein the second reflector comprises the Bragg reflector, and before forming the second reflector, the manufacturing method further comprises:
    forming an ITO layer on the side of the light-emitting structure away from the first reflector, wherein the second reflector is formed on a surface of the ITO layer away from the first reflector.

17. The semiconductor light-emitting device according to claim 16, wherein a surface of the light-emitting structure away from the substrate is flush with a surface of the dielectric layer away from the substrate, and multiple light-emitting structures share one ITO layer.

18. The semiconductor light-emitting device according to claim 14, wherein after forming the second reflector on the side of the light-emitting structure away from the first reflector, the manufacturing method further comprises:
  forming a supporting layer covering the second reflector and the dielectric layer; and
  removing the substrate.

19. The semiconductor light-emitting device according to claim 18, wherein the manufacturing method further comprises: providing a buffer layer between the substrate and the first reflector, wherein
  removing the substrate comprises:
    removing the substrate and the buffer layer; and
  after removing the substrate and the buffer layer, the manufacturing method further comprises:
    making a surface of the dielectric layer away from the supporting layer flush with a surface of the first reflector away from the supporting layer.

20. The semiconductor light-emitting device according to claim 19, wherein after removing the substrate, the manufacturing method further comprises:
  patterning the dielectric layer to form multiple tubular components, wherein the multiple tubular components are around the multiple openings respectively.

* * * * *